United States Patent [19]
Qureshi

[11] Patent Number: 5,793,778
[45] Date of Patent: Aug. 11, 1998

[54] METHOD AND APPARATUS FOR TESTING ANALOG AND DIGITAL CIRCUITRY WITHIN A LARGER CIRCUIT

[75] Inventor: Fazal Ur Rehman Qureshi, San Jose, Calif.

[73] Assignee: National Semiconductor Corporation, Santa Clara, Calif.

[21] Appl. No.: 832,704

[22] Filed: Apr. 11, 1997

[51] Int. Cl.$^6$ .................................................. G06F 11/00
[52] U.S. Cl. .......................................... 371/22.32
[58] Field of Search ............................. 371/22.32, 22.1, 371/24, 25.1; 395/103.06

[56] References Cited

U.S. PATENT DOCUMENTS

5,574,731  11/1996  Qureshi ................................. 371/22.3
5,600,658   2/1997  Qureshi ................................. 371/22.1

*Primary Examiner*—Vincent P. Canney
*Attorney, Agent, or Firm*—Limbach & Limbach L.L.P.

[57] ABSTRACT

A circuit including analog circuitry, digital circuitry partitioned from the analog circuitry, and a boundary scan cell chain along the boundary between the analog and digital circuitry. The chain can be controlled to decouple the analog circuitry from the digital circuitry and supply selected test signals to nodes along the boundary between the analog and digital circuitry during testing. Typically, the circuit is an integrated circuit having external pins for asserting signals directly to and receiving signals directly from each of the analog circuitry, digital circuitry, and boundary scan cell chain. Preferably, each cell of the chain comprises a first multiplexer, a flip-flop, and a second multiplexer having an input coupled to the flip-flop's output, another input coupled to one of the analog circuitry and the digital circuitry, and an output coupled to another of the analog circuitry and the digital circuitry. The cells are serially coupled together so that the chain can be controlled to operate in any of four modes: a non-test mode in which the chain is transparent to the analog and digital circuitry; a serial shift mode in which data values are shifted sequentially into or out of the chain (while the chain is transparent to the analog and digital circuitry); a parallel load mode in which data values are shifted sequentially into the chain and these data values are also sequentially shifted into the analog circuitry and digital circuitry; and a test mode in which data values (previously loaded into the chain) are asserted simultaneously to the analog and digital circuitry. Other embodiments are a boundary scan cell chain of the type used in such a circuit, one of the cells used in such chain, and methods of testing such a circuit.

34 Claims, 2 Drawing Sheets

METHOD AND APPARATUS FOR TESTING ANALOG AND DIGITAL CIRCUITRY WITHIN A LARGER CIRCUIT

FIELD OF THE INVENTION

The present invention relates generally to the testing of circuits. More particularly, the invention pertains to a method and apparatus which simplifies testing of both analog and digital circuitry embedded in a larger circuit (typically an integrated circuit).

DESCRIPTION OF THE RELATED ART

After the manufacturing process of an integrated circuit is complete, it is normally necessary to test the circuit. It is well known that the testing of an integrated circuit has become a significant part of its total cost. Techniques which can simplify such testing can help to reduce manufacturing costs.

It is becoming increasingly common to customize integrated circuits by creating new and/or different capabilities out of existing devices, e.g., the megacell mix and match approach. For example, analog circuitry can be interconnected with digital circuitry, and the interconnected analog and digital circuitry then embedded in a single integrated circuit. In such an integrated circuit, functionality relating to the analog circuitry depends in general on the state of the digital circuitry (which in turn depends on the state of the analog circuitry) so that it is either very difficult or impossible to test functionality of the analog circuitry alone by supplying test signals to the external pins of the integrated circuit (without controlling the status of internal nodes of the integrated circuit at the boundaries between the analog and digital circuitry). Similarly, in such an integrated circuit, functionality relating to the digital circuitry depends in general on the state of the analog circuitry (which in turn depends on the state of the digital circuitry) so that it is either very difficult or impossible to test functionality of the digital circuitry alone by supplying test signals to the external pins of the integrated circuit (without controlling the status of internal nodes of the integrated circuit at the boundaries between the analog and digital circuitry).

Where the analog circuitry is implemented as an integrated circuit and the digital circuitry is implemented as a separate integrated circuit, a significant amount of time and effort is typically required to create testing stimulus and response that is specifically designed for testing each individual integrated circuit. However, when the analog and digital circuitry are both included in a single integrated circuit (in which they interact with each other), the stimulus and response which was used for testing the individual devices is generally not re-useable because the inputs and outputs of each device are no longer accessible.

There have been previous attempts to develop schemes for simplifying the testing of individual devices embedded in a larger device. Such schemes, however, have tended to be very restrictive. For example, one such scheme involved multiplexing input/output pins for all buried functions. One problem with this scheme, however, is that there may not be enough I/O pins for all of the buried functions.

Thus, there is a need for a method and/or apparatus which simplifies the testing of either analog or digital circuitry alone (and optionally also both the analog and digital circuitry at the same time), where the analog and digital circuitry are embedded (so as to interact with each other) in a single larger circuit (e.g., an integrated circuit).

SUMMARY OF THE INVENTION

In preferred embodiments, the invention is a mixed signal circuit including analog circuitry, digital circuitry partitioned from the analog circuitry, and a boundary scan cell chain connected along the boundary between the analog and digital circuitry for selectively decoupling the analog from the digital circuitry (and supplying selected signals to nodes along the boundary) during testing. The boundary scan cell chain comprises cells, each cell connected so as to intercept a different one of the signals to be exchanged between the analog and digital circuitry, and each cell operable in a nontest mode in which it is transparent to the analog and digital circuitry in the sense that it passes through (across the boundary) each signal received from one of the analog and digital circuitry that is intended for assertion to the other of the analog and digital circuitry. Preferably, the mixed signal circuit is an integrated circuit which includes external pins for asserting signals directly to and receiving signals directly from each of the analog circuitry, digital circuitry, and boundary scan cell chain.

In preferred embodiments, each cell of the boundary scan cell chain comprises a first multiplexer (having a "scan in data" input, an "output data" input, and an output), a flip-flop (having a test clock input, a data input coupled to the first multiplexer's output, and an output), and a second multiplexer having a first input coupled to one of the analog circuitry and the digital circuitry, a second input coupled to the flip-flop's output, and an output coupled to another of the analog circuitry and the digital circuitry. The cells are serially coupled together such that the chain can be controlled to operate in any of four modes: a non-test mode (sometimes denoted herein as a normal operating mode) in which the chain is transparent to the analog and digital circuitry; a scan shift mode (also denoted herein as a serial shift mode) in which data values are shifted sequentially into or out from the chain (while the chain is transparent to the analog and digital circuitry); a parallel load mode in which data values are shifted sequentially into the chain and these data values are also sequentially shifted into the analog circuitry and digital circuitry; and a test mode in which data values (previously loaded into the chain) are asserted simultaneously to the analog and digital circuitry.

Other embodiments of the invention are a boundary scan cell chain of the type used in the inventive mixed signal circuit, and one of the cells used in such boundary scan cell chain.

Other embodiments of the invention are methods of testing a mixed signal circuit (which is preferably an integrated circuit) including analog circuitry, digital circuitry coupled to (but partitioned from) the analog circuitry, and a boundary scan cell chain between the analog and digital circuitry, wherein during normal operation (i.e., non-test mode operation) of the mixed signal circuit, the digital circuitry asserts signals ("digital-to-analog" signals) to the analog circuitry, and the analog circuitry asserts signals ("analog-to-digital" signals) to the digital circuitry. In a class of preferred embodiments for testing the analog circuitry, the method includes the following steps:

(a) setting all digital-to-analog signals to desired test values (by performing a scan shift operation which shifts test signals having said test values sequentially into the boundary scan cell chain); and (b) while asserting the test values to the analog circuitry, testing the analog circuitry by applying one or more additional test signals (from an external device) directly to one or more external pins of the analog circuitry and receiving (at the external device) resulting output signals at one or more external pins of the analog circuitry. Optionally also, the following steps are performed:

(c) performing a load operation to capture the analog-to-digital signals being asserted by the analog circuitry at the end of step (b); and (d) after step (c), performing another scan shift operation to shift the captured analog-to-digital signals sequentially out of the boundary scan cell chain.

These steps can be repeated, each time using a different set of input stimuli (i.e., each time asserting a different set of digital-to-analog signals during step (a) and/or a different set of test signals during step (b)). At any time during step (b), the boundary scan cell chain can be controlled to capture a set of parallel analog-to-digital signals from the analog circuitry, and these captured signals can be shifted out of the boundary scan cell chain (to an external device) for analysis (to test real interconnectivity between the analog and digital circuitry).

In a class of preferred embodiments for testing the digital circuitry, the method includes the following steps:

(a) setting all analog-to-digital signals to desired test values (by performing a scan shift operation which shifts test signals having said test values sequentially into the boundary scan cell chain);

(b) while asserting the test values to the digital circuitry, testing the digital circuitry by applying one or more test signals (from an external device) directly to one or more external pins of the digital circuitry and receiving (at the external device) resulting output signals at one or more external pins of the digital circuitry.

Optionally, the following steps are also performed:

(c) performing a load operation to capture the digital-to-analog signals being asserted by the digital circuitry at the end of step (b); and (d) after step (c), performing another scan shift operation to shift the captured digital-to-analog signals sequentially out of the boundary scan cell chain.

These steps can be repeated, each time using a different set of input stimuli (i.e., each time asserting a different set of analog-to-digital signals during step (a) and/or a different set of test signals during step (b)). At any time during step (b), the boundary scan cell chain can be controlled to capture a set of parallel digital-to-analog signals from the digital circuitry, and these captured signals can be shifted out of the boundary scan cell chain (to an external device) for analysis (to test real interconnectivity between the analog and digital circuitry).

DETAILED DESCRIPTION OF THE INVENTION

Figure 1:
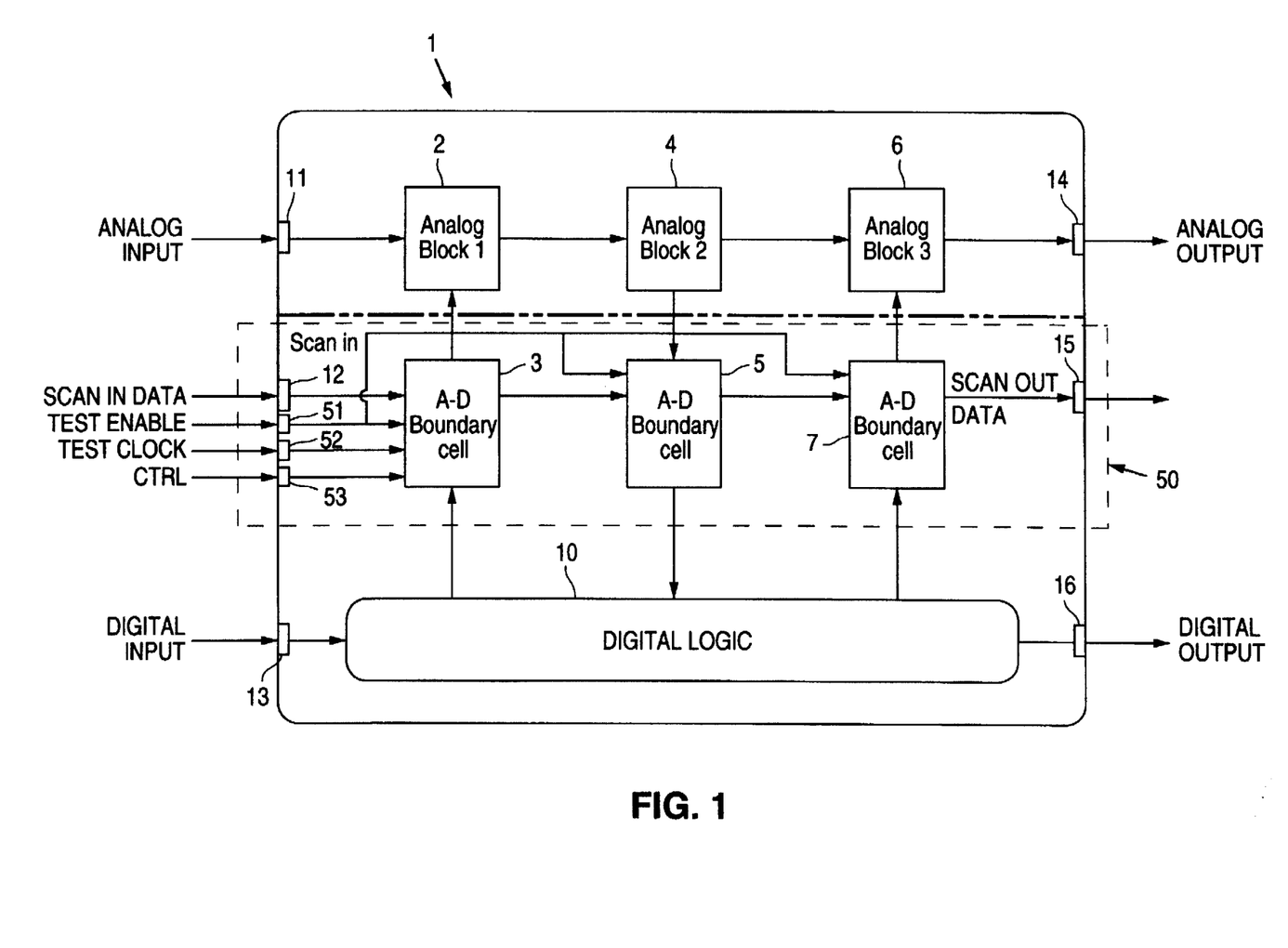
FIG. 1 is a block diagram of an integrated circuit in accordance with a preferred embodiment of the invention.
Figure 2:
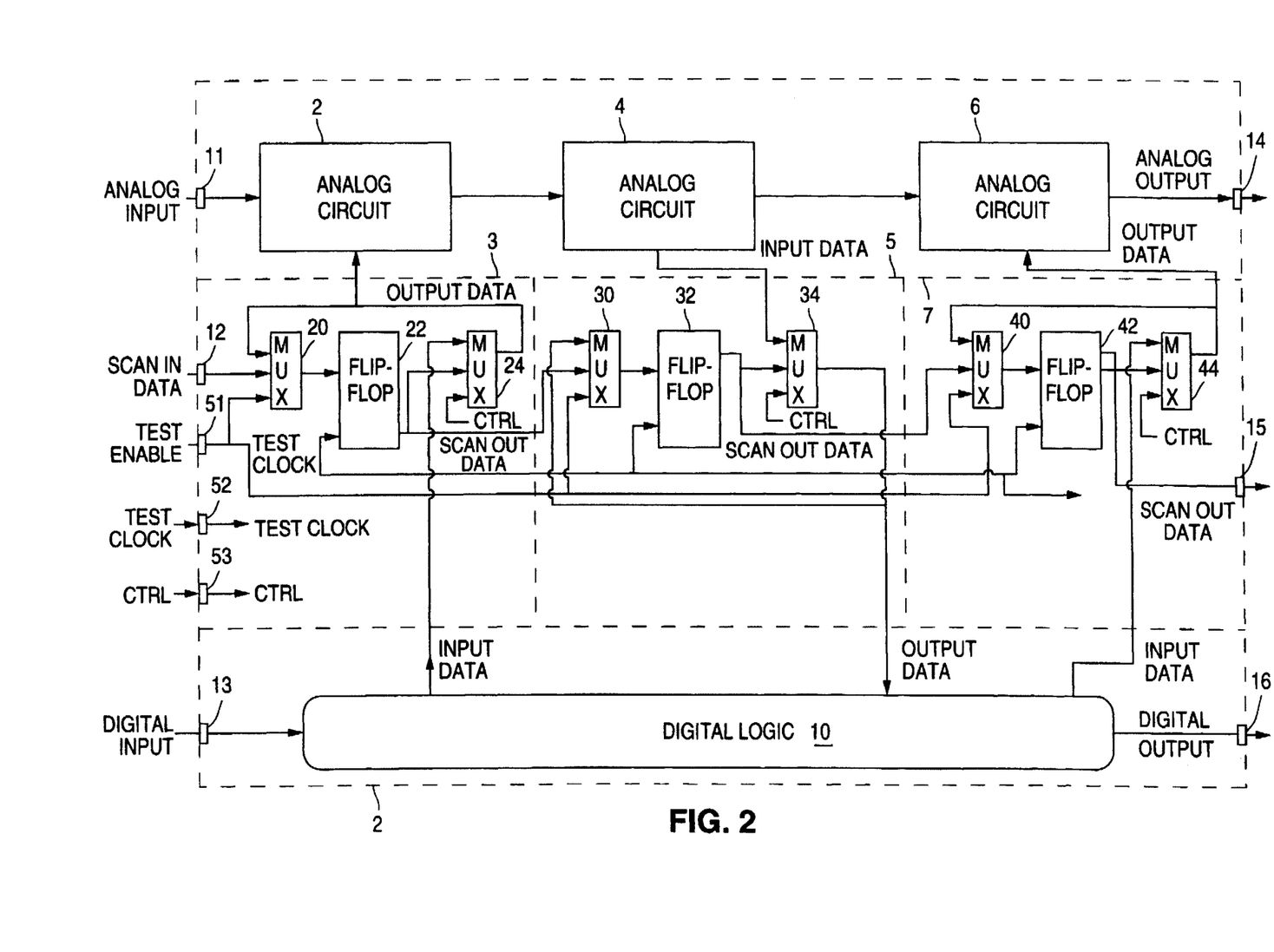
FIG. 2 is a more detailed block diagram of the integrated circuit of FIG. 1.

FIG. 1 is a block diagram of a preferred embodiment of an integrated circuit which embodies the invention. FIG. 2 is a more detailed block diagram of the circuit of FIG. 1. Integrated circuit ("chip") 1 of FIGS. 1 and 2 is a mixed signal circuit which includes digital logic circuitry 10, analog circuitry 2, analog circuitry 4, analog circuitry G, and boundary scan cell chain circuit 50. The expression "mixed signal" is used herein to describe a circuit that includes both analog circuitry and digital circuitry. The mixed signal circuit of the invention includes analog circuitry that is partitioned from digital circuitry, in the sense that each signal asserted by the analog circuitry for reception by the digital circuitry (each "analog-to-digital" signal) propagates to the digital circuitry through a cell of a boundary scan cell chain, and each signal asserted by the digital circuitry for reception by the analog circuitry (each "digital-to-analog" signal) propagates to the analog circuitry through a cell of the boundary scan cell chain.

With reference to FIGS. 1 and 2, boundary scan cell chain circuit 50 comprises boundary cell 3, boundary cell 5, and boundary cell 7 connected in series as shown, between external pin 12 and external pin 15. Chip 1 is designed with analog circuitry 2, 4, and 6 partitioned from digital logic circuitry 10, in the sense that signals flow between the analog circuitry (2, 4, 6) and the digital circuitry (10) only through the cells of boundary scan cell chain 50.

Analog circuitry 2, analog circuitry 4, and analog circuitry 6 are connected in series as shown, between external pin 11 (which can be replaced by a set of external pins, in alternative embodiments) and external pin 14 (which can be replaced by a set of external pins, in alternative embodiments). Digital logic circuitry 10 is connected between external pin 13 (which can be replaced by a set of external pins, in alternative embodiments) and external pin 16 (which can be replaced by a set of external pins, in alternative embodiments).

Boundary scan cell chain 50, and variations thereon, are itself embodiments of the invention. Each such cell chain is a feature which can be implemented in any of a variety of mixed signal circuits having partitioned digital and analog circuit portions, to simplify the testing of such circuits. Cell chain 50 provides the ability to isolate and test either the analog or digital circuitry as though it were a stand alone device.

During normal (i.e., non-test mode) operation of integrated circuit 1, digital logic 10 asserts signals (denoted herein as "digital-to-analog" signals) through chain 50 to analog circuitry 2, 4, and 6, and the analog circuitry asserts signals (denoted herein as "analog-to-digital" signals) through chain 50 to digital logic 10. Cells 3, 5, and 7 of chain 50 can all have identical design, even though some of them (e.g., cell 3) pass through only "digital-to-analog" signals during normal operation, and others of them (e.g., cell 5) pass through only "analog-to-digital" signals during normal operation. The preferred embodiment of each of cells 3, 5, and 7 (to be described with reference to FIG. 2) and variations on this embodiment are aspects of the invention.

In variations on the preferred embodiment of cells 3, 5, and 7, each cell which receives analog-to-digital signals differs in one respect from each cell which receives digital-to-analog signals: the former type of cell includes a signal conversion circuit, but the latter type of cell does not include a signal conversion circuit. The signal conversion circuit is connected between the analog circuit which asserts analog-to-digital signals to the cell and the cell's input data multiplexer (e.g., between analog circuitry 4 and input data multiplexer 34 of FIG. 2). The signal conversion circuit performs any signal conversion (e.g., current to voltage conversion and/or voltage level shifting) on the analog-to-digital signals that is needed to put these signals in a form in which they can be processed by the input data multiplexer.

In response to the control signals "TEST ENABLE" and "CTRL" and the clock signal "TEST CLOCK", boundary scan cell chain 50 can also operate in any of: a serial shift mode in which data values are shifted sequentially into the chain (from pin 12) or out from the chain (to pin 15) while the chain is transparent to the analog and digital circuitry (in the sense that each output multiplexer of the chain is controlled to pass through to the analog circuitry the digital-to-analog signals it receives from the digital circuitry, and to pass through to the digital circuitry the analog-to-digital signals it receives from the analog circuitry); a parallel load mode in which data values are shifted sequentially into the chain (from pin 12) and these data values are also sequentially shifted into the analog circuitry and digital circuitry; and a test mode in which data values (previously loaded into the chain) are asserted simultaneously to analog circuitry 2, 4, 6 and digital circuitry 10. In the test mode (and the parallel load mode), cells 3, 5, and 7 decouple analog circuitry 2, 4, 6 from digital circuitry 10 and assert selected signals (e.g., test values that have been serially shifted into chain 50 from an external device) to nodes of chip 1 along the boundary between analog circuitry 2, 4, 6 and digital circuitry 10.

Signals TEST ENABLE, TEST CLOCK, and CTRL are supplied from an external device to external pins 51, 52, and 53 of boundary scan cell chain 50, respectively (as shown in FIGS. 1 and 2). In alternative embodiments, signals TEST ENABLE, TEST CLOCK, and CTRL are generated by control circuitry within the inventive boundary scan cell chain (or within the integrated circuit which includes the inventive boundary scan cell chain). Digital circuitry 10 can include its own test circuitry (which can in turn include a digital scan chain) for use in a test mode in which digital circuitry 10 alone is tested. The signal TEST ENABLE can be supplied both to the test circuitry within circuitry 10 (to enable such test circuitry for use in a test mode) and to boundary scan cell chain 50.

During a normal operating mode of chip 1, signals TEST ENABLE, CTRL, and TEST CLOCK have values (e.g., each of CTRL and TEST ENABLE has a constant value indicative of a logical zero) that cause cells 3, 5, and 7 of boundary scan cell chain 50 to be transparent to analog and digital circuitry 2, 4, 6, and 10 in the sense that cells 3 and 7 pass through to analog circuitry 2 and 6, respectively, the digital-to-analog signals they receive from digital circuitry 10, and cell 5 passes through to digital circuitry 10 each analog-to-digital signal it receives from analog circuitry 4. In such normal operating mode, chip 1 typically receives analog input signals at pin 11 and/or digital input signals at pin 13, and asserts in response analog output signals at pin 14 and digital output signals at pin 16 (while asserting digital-to-analog signals and analog-to-digital signals at internal nodes at the boundary between analog circuitry 2, 4, 6 and digital circuitry 10). In the normal operating mode, TEST CLOCK typically has a square waveform (but it could have another waveform, such as a flat waveform indicative of a logical zero).

During a first test mode of chip 1, a first set of test signals is shifted into cells of boundary scan cell chain 50 and then asserted to analog circuitry 2, 4, 6 and digital circuitry 10 (while the analog and digital circuitry are decoupled from each other), and then one (or both) of the analog circuitry and the digital circuitry is (are) tested while remaining decoupled from each other. During a first portion of the first test mode, chain 50 is controlled to operate in the above-mentioned serial shift mode. During the serial shift mode, signals TEST ENABLE, CTRL, and TEST CLOCK initially have values that sequentially shift in a first set of test signals to cells 3, 5, and 7 thus causing cells 3, 5, and 7 to become loaded with the first set of test signals (e.g., TEST ENABLE has a value indicative of a logical one, CTRL has a value indicative of a logical zero, and TEST CLOCK has a square wave waveform for a fixed duration) while remaining transparent to circuitry 2, 4, 6, and 10. During a second portion of the first test mode (after the first set of test signals has been serially shifted into chain 50), signals TEST ENABLE, CTRL, and TEST CLOCK take on values causing cells 3, 5, and 7 to remain in a test mode in which they assert all test signals in the first set simultaneously (in parallel) to the analog and digital circuitry (e.g., TEST ENABLE takes on a value indicative of a logical zero, CTRL takes on a value indicative of a logical one, and TEST CLOCK continues to have a square wave waveform). During this test mode, while the first set of test signals is asserted in parallel to the analog and digital circuitry, additional test signals are asserted to the analog circuitry and/or the digital circuitry (e.g., from one or more external devices to pin 12 and/or pin 13 shown in FIGS. 1 and 2) and the response of the analog and/or the digital circuitry to both the first set of test signals and the additional test signals is monitored (e.g., by monitoring the output signals asserted at pins 14 and 16 shown in FIGS. 1 and 2).

In typical implementations of chip 1, each transition of signal TEST CLOCK triggers both the loading of a bit (e.g., a test bit) from multiplexer 20 into flip-flop 22 and the assertion of a previously loaded bit from flip-flop 22 to multiplexers 24 and 30, and triggers both the loading of a bit from multiplexer 30 into flip-flop 32 and the assertion of a previously loaded bit from flip-flop 32 to multiplexers 34 and 40, and triggers both the loading of a bit from multiplexer 40 into flip-flop 42 and the assertion of a previously loaded bit from flip-flop 42 to multiplexer 44 and pin 15. Control signal TEST ENABLE controls which of the two inputs to each of multiplexers 20, 30, and 40 is asserted to the output of each such multiplexer, and control signal CTRL controls which of the two inputs each of multiplexers 24, 34, and 44 is asserted to the output of each such multiplexer.

In the above-mentioned parallel load mode of chip 1, chain 50 is controlled to shift data values sequentially from pin 12 into the cells of chain 50 and also to shift these data values sequentially into analog circuitry 2 and 6 and digital circuitry 10. In a preferred implementation, signal TEST ENABLE has a value indicative of a logical one, CTRL has a value indicative of a logical one, and TEST CLOCK has a square wave waveform for a fixed duration during the parallel load mode. Thus, the input multiplexer in each cell (multiplexer 20, 30, or 40) selects SCAN IN DATA from pin 12 (or SCAN OUT DATA from the flip-flop of the previous cell), and the output multiplexer in each cell (multiplexer 24, 34, or 44) selects the output of the flip-flop of such cell (e.g., multiplexer 24 selects the output of flip-flop 22 in cell 3). Thus, in response to transitions of the TEST CLOCK, data values are sequentially shifted from pin 12 through flip-flops 22, 32, and 42 of chain 50, and also through output multiplexer 24 to analog circuitry 2, through output multiplexer 34 to digital circuitry 10, and through output multiplexer 44 to analog circuitry 6.

During a third test mode of chip 1, a set of signals (to be denoted as "status signals" since they are indicative of the status of one or more of analog circuitry 2, 4, and 6, or of digital circuitry 10) is loaded (in parallel) into cells of boundary scan cell chain 50 from either the analog or the digital circuitry, and the status signals are then shifted out of the cells (e.g., to pin 15 shown in FIGS. 1 and 2) to an external device. For example, chain 50 can operate in the third test mode following a previous test of analog circuitry 2, 4, 6, as follow: at a desired time after test signals have been asserted from an external device to external pin 11 of the analog circuitry (while a first subset of cells of boundary scan cell chain 50 asserts test values to internal nodes of the analog circuitry), chain 50 is controlled to perform a load operation to capture (at a second subset of cells of chain 50) analog-to-digital signals being asserted by the analog circuitry (in response to appropriate values of signals TEST ENABLE, CTRL, and TEST CLOCK, e.g., in response to each of TEST ENABLE and CTRL having a value indicative of a logical zero, and to assertion of one transition of TEST CLOCK to "clock in" the analog-to-digital signals to a flip-flop within each cell in the second subset). Then the captured values are shifted out of chain 50 to pin 15 which is typically coupled to an external device (e.g., by asserting TEST ENABLE with a value indicative of a logical one, and TEST CLOCK as a square wave for a fixed duration). For another example, chain 50 can operate in the third test mode following a previous test of digital circuitry 10, as follows: at a desired time after test signals have been asserted from an external device to external pin 13 of digital circuitry 10 (while the cells in the second subset assert test values to internal nodes of the digital circuitry), a load operation is performed to capture (at the first subset of cells of chain 50) digital-to-analog signals being asserted by the digital circuitry (e.g., by asserting each of TEST ENABLE and CTRL with a value indicative of a logical zero, and asserting one transition of TEST CLOCK to "clock in" the digital-to-analog signals to a flip-flop within each cell in the first subset). Then the captured values are scanned out of chain 50 to pin 15 which is typically coupled to an external device (e.g., by asserting TEST ENABLE with a value indicative of a logical one, and TEST CLOCK as a square wave for a fixed duration).

With reference to FIG. 2, each cell of boundary scan cell chain 50 preferably comprises an input multiplexer (having a "scan in data" input, an "output data" input, and an output), a flip-flop (having a test clock input, a data input coupled to the input multiplexer's output, and an output), and an output multiplexer (having a first input coupled to one of the analog circuitry and the digital circuitry, a second input coupled to the flip-flop's output, and an output coupled to another of the analog circuitry and the digital circuitry). For example, cell 3 includes input multiplexer 20 of this type, flip-flop 22 of this type, and output multiplexer 24 of this type, cell 5 includes input multiplexer 30 of this type, flip-flop 32 of this type, and output multiplexer 34 of this type, and cell 7 includes input multiplexer 40 of this type, flip-flop 42 of this type, and output multiplexer 44 of this type. The "first input" of multiplexer 34 (of cell 5) is coupled to analog circuitry 4 (to receive an analog-to-digital signal from an internal node thereof). In contrast, the "first input" of each of multiplexer 24 and 44 is coupled to digital circuitry 10 (each for receiving a digital-to-analog signal from a different internal node of digital circuitry 10).

Cells 3, 5, and 7 are serially coupled together as shown (with the "scan in data" input of multiplexer 20 coupled to pin 12, and the output of flip-flop 42 coupled to pin 15) to be capable of performing: a serial shift operation which shifts test values (from pin 12) sequentially into boundary scan cell chain 50 (while cells 3, 5, and 7 are to chip 1's analog circuitry and chip 1's digital circuitry); or a parallel load operation in which data values are shifted sequentially into the chain (from pin 12) and these data values are also sequentially shifted into the analog circuitry and digital circuitry; or to assert a set of three signals (each of which has been previously loaded into a different one of the cells) in parallel to one or more of circuits 2, 4, 6, and 10.

Although boundary scan cell chain 50 of FIGS. 1 and 2 has three identical cells (cells 3, 5, and 7), the chain can alternatively have any number of such cells, each cell having the "first" input of its output multiplexer coupled to a different node of one of analog or digital circuits 2, 4, 6, and 10. More generally, the inventive boundary scan cell chain can have any number of serially connected cells (which are preferably identical), each cell having a 2:1 multiplexer for connection between an analog circuit and a digital circuit (where the analog and digital circuits are portions (partitioned from each other) of an integrated circuit. The 2:1 multiplexer has one input configured for connection to a node of one of the analog circuit and the digital circuit, another input configured for connection to another one of the cells, and an output configured for connection to the other of the analog circuit and the digital circuit.

In preferred embodiments, the mixed signal circuit of the invention (which includes analog circuitry, digital circuitry partitioned from the analog circuitry, and a boundary scan cell chain along the boundary between the analog and digital circuitry) is implemented as an integrated circuit. The boundary scan cell chain provides access to internal nodes of the integrated circuit (nodes along the boundary between the analog and digital circuitry which are not connected directly to external pins of the integrated circuit) to enable the status of these internal nodes to be monitored during testing of the integrated circuit and to allow the internal nodes to be held at desired test voltages (or stimulated by a desired sequence of test voltages) during testing of the integrated circuit. Alternatively, the mixed signal circuit of the invention (which includes analog circuitry, digital circuitry partitioned from the analog circuitry, and a boundary scan cell chain along the boundary between the analog and digital circuitry) is not implemented as an integrated circuit. In such alternative embodiments, even though the nodes (along the boundary between the analog and digital circuitry) to which the boundary scan cell is coupled may be accessible to test probes or the like, presence of the boundary scan cell chain nevertheless provides the following important benefit. Presence of the boundary scan cell chain allows the mixed signal circuit to operate in either of the following modes: a normal operating mode in which the boundary scan cell chain is transparent to the analog and digital circuitry; and at least one test mode in which the chain decouples the analog from the digital circuitry and asserts test signals (previously loaded into the chain) to the analog and digital circuitry (in place of the analog-to-digital and digital-to-analog signals that would otherwise be asserted across the boundary in the normal operating mode).

Another aspect of the invention is a method for designing and manufacturing a mixed signal circuit (preferably implemented as an integrated circuit), including the steps of:

(a) designing the mixed signal circuit so that analog portions of the circuit are partitioned from digital portions of the circuit;

(b) including in the design a boundary scan cell chain between the analog and digital portions, such that each cell of the chain intercepts a different one of the signals to be exchanged between the analog and digital portions; and (c) manufacturing the mixed signal circuit in accordance with the design.

The digital portion can be designed to include its own scan chain (a "digital scan chain") for use in a test mode in which the digital portion alone is tested. The boundary scan cell chain can be implemented as a part of the digital scan chain.

It should be understood that various other alternatives to the embodiments of the invention described herein may be employed in practicing the invention. It is intended that the following claims define the scope of the invention and that structures and methods within the scope of these claims and their equivalents be covered thereby.

What is claimed is:

1. A mixed signal circuit, including:

analog circuitry configured to assert analog-to-digital signals;

digital circuitry configured to assert digital-to-analog signals; and a boundary scan cell chain connected between the analog circuitry and the digital circuitry and coupled to receive control signals, wherein the boundary scan cell chain is configured to operate in a normal operating mode in response to first values of the control signals and to operate in a test mode in response to second values of the control signals, wherein each analog-to-digital signal asserted by the analog circuitry and each digital-to-analog signal asserted by the digital circuitry is asserted to the boundary scan cell chain, and the boundary scan cell chain asserts said each analog-to-digital signal to the digital circuitry and said each digital-to-analog signal to the analog circuitry in the normal operating mode, and wherein the boundary scan cell chain decouples the analog circuitry from the digital circuitry in the test mode.

2. The mixed signal circuit of claim 1, wherein the mixed signal circuit has an input node and an output node, and the boundary scan cell chain comprises:

a set of cells serially connected together between the input node and the output node, wherein the cells are configured:

to perform a serial shift operation to shift test signals sequentially into the cells from the input node, while the boundary scan cell chain asserts each analog-to-digital signal received during the serial shift operation to the digital circuitry and each digital-to-analog signal received during the serial shift operation to the analog circuitry, in response to third values of the control signals until said cells are loaded with the test signals; and then to assert the test signals that have been loaded in the cells in parallel to the analog circuitry and the digital circuitry in response to said second values of the control signals.

3. The mixed signal circuit of claim 2, wherein the cells are also configured to perform a load operation in response to fourth values of the control signals, wherein test signals are shifted sequentially into the cells from the input node during the load operation and the test signals are also shifted sequentially from the cells into at least one of the analog circuitry and the digital circuitry during said load operation.

4. The mixed signal circuit of claim 1, wherein the mixed signal circuit has an input node and an output node, and the boundary scan cell chain comprises:

a set of cells serially connected together between the input node and the output node, each of the cells comprising:

an input multiplexer having a first input, a second input, a control input coupled to receive a first one of the control signals, and an output;

a flip-flop having a clock input coupled to receive a second one of the control signals, a data input coupled to the output of the input multiplexer, and a data output; and an output multiplexer having a first input coupled to one of the analog circuitry and the digital circuitry, a second input coupled to the data output of the flip-flop, an output coupled to another of the analog circuitry and the digital circuitry and to the first input of the input multiplexer, and a control input coupled to receive a third one of the control signals, and wherein the second input of the input multiplexer of a first one of the cells is coupled to the input node, the second input of the input multiplexer of each of the other cells is coupled to the data output of the flip flop of a preceding one of the cells, and the data output of the flip flop of a last one of the cells is coupled to the output node.

5. The mixed signal circuit of claim 4, wherein each of a first subset of the cells is configured to capture in the flip-flop thereof one of the digital-to-analog signals from the digital circuitry in response to the first values of the control signals, and each of a second subset of the cells is configured to capture in the flip-flop thereof one of the analog-to-digital from the analog circuitry in response to the first values of the control signals.

6. The mixed signal circuit of claim 1, wherein the mixed signal circuit is an integrated circuit.

7. The mixed signal circuit of claim 6, wherein the integrated circuit includes at least a first external pin coupled to assert signals directly to the analog circuitry, at least a second external pin coupled to receive signals directly from the analog circuitry, at least a third external pin coupled to assert signals directly to the digital circuitry, at least a fourth external pin coupled to receive signals directly from the digital circuitry, at least a fifth external pin coupled to assert signals directly to the boundary scan cell chain, and at least a sixth external pin coupled to receive signals directly from the boundary scan cell chain.

8. The mixed signal circuit of claim 7, wherein the boundary scan cell chain comprises:

a set of cells serially connected together between the fifth external pin and the sixth external pin, wherein the cells are configured:

to perform a serial shift operation to shift test signals from the fifth external pin sequentially into the cells in response to third values of the control signals until said cells are loaded with the test signals, wherein the boundary scan cell chain asserts each analog-to-digital signal received during the serial shift operation to the digital circuitry and each digital-to-analog signal received during the serial shift operation to the analog circuitry; and then to assert the test signals that have been loaded in the cells in parallel to the analog circuitry and the digital circuitry in response to said second values of the control signals.

9. The mixed signal circuit of claim 7, wherein the boundary scan cell chain comprises:

a set of cells serially connected together between the fifth external pin and the sixth external pin, each of the cells comprising:

an input multiplexer having a first input, a second input, a control input coupled to receive a first one of the control signals, and an output;

a flip-flop having a clock input coupled to receive a second one of the control signals, a data input coupled to the output of the input multiplexer, and a data output; and an output multiplexer having a first input coupled to one of the analog circuitry and the digital circuitry, a second input coupled to the data output of the flip-flop, an output coupled to another of the analog circuitry and the digital circuitry and to the first input of the input multiplexer, and a control input coupled to receive a third one of the control signals, and wherein the second input of the input multiplexer of a first one of the cells is coupled to the fifth external pin, the second input of the input multiplexer of each of the other cells is coupled to the data output of the flip flop of a preceding one of the cells, and the data output of the flip flop of a last one of the cells is coupled to the sixth external pin.

10. The mixed signal circuit of claim 1, wherein the mixed signal circuit has an input node and an output node, the boundary scan cell chain is connected between the input node and the output node, the boundary scan cell chain is configured to perform a serial shift operation to shift test signals sequentially in from the input node in response to third values of the control signals until said boundary scan cell chain is loaded with the test signals, wherein the boundary scan cell chain is configured to assert each analog-to-digital signal received during the serial shift operation to the digital circuitry and each digital-to-analog signal received during the serial shift operation to the analog circuitry.

11. The mixed signal circuit of claim 10, wherein the boundary scan cell chain is configured to perform a load operation in response to fourth values of the control signals, wherein test signals are shifted sequentially into the cells from the input node during the load operation and the test signals are also shifted sequentially from the cells into at least one of the analog circuitry and the digital circuitry during said load operation.

12. A boundary scan cell chain for connection to a mixed signal circuit including analog circuitry configured to assert analog-to-digital signals and digital circuitry partitioned from the analog circuitry and configured to assert digital-to-analog signals, the boundary scan cell chain including:

an input node;
an output node;
a set of cells serially connected together between the input node and the output node, each of the cells comprising:
an input multiplexer having a first input, a second input, a control input for receiving a first control signal, and an output;
a flip-flop having a clock input for receiving a test clock signal, a data input coupled to the output of the input multiplexer, and a data output; and
an output multiplexer having a first input for coupling to one of the analog circuitry and the digital circuitry, a second input coupled to the data output of the flip-flop, an output for coupling to another of the analog circuitry and the digital circuitry, and a control input for receiving a second control signal, wherein the output of the output multiplexer is coupled to the first input of the input multiplexer, and wherein
the second input of the input multiplexer of a first one of the cells is coupled to the input node, the second input of the input multiplexer of each of the other cells is coupled to the data output of the flip flop of a preceding one of the cells, and the data output of the flip flop of a last one of the cells is coupled to the output node.

13. The boundary scan cell chain of claim 12, wherein each of the cells is configured to operate in a normal operating mode in response to a first value of the first control signal and a first value of the second control signal, and in a test mode in response to the first value of the first control signal and a second value of the second control signal, and wherein said each of the cells is configured:

to assert each signal received at the first input of the output multiplexer thereof to the output of the output multiplexer thereof in the normal operating mode; and
to decouple the first input of the output multiplexer thereof from the output of the output multiplexer thereof in the test mode.

14. The boundary scan cell chain of claim 13, wherein said each of the cells is configured:

to shift signals sequentially from the input multiplexer thereof to the data output of the flip flop thereof in response to the test clock signal;
to assert a signal from the second input of the output multiplexer thereof to the output of the output multiplexer thereof in response to the second value of the second control signal; and
to assert a signal from the first input of the output multiplexer to the output of the output multiplexer thereof in response to the first value of the second control signal.

15. The boundary scan cell chain of claim 13, wherein said each of the cells is configured to operate in a serial shift mode in response to a second value of the first control signal and the first value of the second control signal.

16. The boundary scan cell chain of claim 13, wherein said each of the cells is configured to operate in a parallel load mode in response to a second value of the first control signal and the second value of the second control signal.

17. A boundary scan cell for connection to a mixed signal circuit including analog circuitry configured to assert analog-to-digital signals and digital circuitry partitioned from the analog circuitry and configured to assert digital-to-analog signals, said boundary scan cell including:

an input multiplexer having a first input, a second input, a control input for receiving a first control signal, and an output;
a flip-flop having a clock input for receiving a test clock signal, a data input coupled to the output of the input multiplexer, and a data output; and
an output multiplexer having a first input for coupling to one of the analog circuitry and the digital circuitry, a second input coupled to the data output of the flip-flop, an output for coupling to another of the analog circuitry and the digital circuitry, and a control input for receiving a second control signal, wherein the output of the output multiplexer is coupled to the first input of the input multiplexer.

18. The boundary scan cell of claim 17, wherein said boundary scan cell is configured:

to assert each signal received at the first input of the output multiplexer to the output of the output multiplexer in response to a first value of the second control signal; and
to decouple the first input of the output multiplexer from the output of the output multiplexer in response to a second value of the second control signal.

19. The boundary scan cell of claim 18, wherein said boundary scan cell is configured:

to shift signals sequentially from the input multiplexer to the data output of the flip flop in response to the test clock signal;
to assert a signal from the second input of the output multiplexer to the output of the output multiplexer in response to the second value of the second control signal.

20. The boundary scan cell of claim 18, wherein said boundary scan cell is configured to operate in a test mode in response to a first value of the first control signal and the second value of the second control signal.

21. The boundary scan cell of claim 20, wherein said boundary scan cell is configured to operate in a serial shift mode in response to a second value of the first control signal and the first value of the second control signal.

22. The boundary scan cell of claim 20, wherein said boundary scan cell is configured to operate in a parallel load mode in response to a second value of the first control signal and the second value of the second control signal.

23. A method of testing a mixed signal circuit including analog circuitry, digital circuitry partitioned from the analog circuitry, and a boundary scan cell chain coupled between the analog circuitry and the digital circuitry, wherein during normal operation of the mixed signal circuit, the digital circuitry asserts digital-to-analog signals through the boundary scan cell chain to the analog circuitry, and the analog circuitry asserts analog-to-digital signals through the boundary scan cell chain to the digital circuitry, said method comprising the steps of:

(a) performing a scan shift operation to shift test signals indicative of a set of test values sequentially into the boundary scan cell chain, and asserting said test signals rather than the digital-to-analog signals to the analog circuitry; and (b) while asserting said test signals to the analog circuitry, testing the analog circuitry by applying at least one additional test signal to at least one input node of the analog circuitry and detecting resulting output signals from at least one output node of the analog circuitry.

24. The method of claim 23, wherein step (a) includes the steps of:

performing a serial shift operation while the digital circuitry asserts said digital-to-analog signals through the boundary scan cell chain to the analog circuitry and the analog circuitry asserts said analog-to-digital signals through the boundary scan cell chain to the digital circuitry, and after performing the serial shift operation, asserting said test signals rather than the digital-to-analog signals to the analog circuitry.

25. The method of claim 23, wherein step (a) includes the step of:

performing the scan shift operation while isolating the digital circuitry from the analog circuitry, and while shifting the test signals sequentially into the analog circuitry and the digital circuitry.

26. The method of claim 23, also including the steps of:

(c) performing a load operation to capture the analog-to-digital signals being asserted by the analog circuitry at the end of step (b); and (d) after step (c), performing another scan shift operation to shift the captured analog-to-digital signals sequentially out of the boundary scan cell chain.

27. The method of claim 23, wherein the mixed signal circuit is an integrated circuit having at least a first external pin for asserting signals directly to the analog circuitry, at least a second external pin for receiving signals directly from the analog circuitry, at least a third external pin for asserting signals directly to the boundary scan cell chain, and at least a fourth external pin for receiving signals directly from the boundary scan cell chain, wherein step (a) includes the step of:

performing a scan shift operation to shift said test signals from the third external pin sequentially into the boundary scan cell chain, and wherein step (b) includes the steps of:

applying said one or more test signals from an external device directly to the first external pin and receiving at the external device said resulting output signals which have been asserted to the second external pin.

28. The method of claim 27, also including the steps of:

(c) performing a load operation to capture at least one analog-to-digital signal being asserted to said boundary scan cell chain by the analog circuitry at the end of step (b); and (d) after step (c), performing another scan shift operation to shift the analog-to-digital signal captured during step (c) out of the boundary scan cell chain to the fourth external pin.

29. A method of testing a mixed signal circuit including analog circuitry, digital circuitry partitioned from the analog circuitry, and a boundary scan cell chain coupled between the analog circuitry and the digital circuitry, wherein during normal operation of the mixed signal circuit, the digital circuitry asserts digital-to-analog signals through the boundary scan cell chain to the analog circuitry, and the analog circuitry asserts analog-to-digital signals through the boundary scan cell chain to the digital circuitry, said method comprising the steps of:

(a) performing a scan shift operation to shift test signals indicative of a set of test values sequentially into the boundary scan cell chain, and asserting said test signals rather than the analog-to-digital to the digital circuitry; and (b) while asserting said test signals to the digital circuitry, testing the digital circuitry by applying at least one additional test signal to at least one input node of the digital circuitry and detecting resulting output signals from at least one output node of the digital circuitry.

30. The method of claim 29, wherein step (a) includes the steps of:

performing a serial shift operation while the digital circuitry asserts said digital-to-analog signals through the boundary scan cell chain to the analog circuitry and the analog circuitry asserts said analog-to-digital signals through the boundary scan cell chain to the digital circuitry, and after performing the serial shift operation, asserting said test signals rather than the analog-to-digital signals to the digital circuitry.

31. The method of claim 29, wherein step (a) includes the step of:

performing the scan shift operation while isolating the digital circuitry from the analog circuitry, and while shifting the test signals sequentially into the digital circuitry and the analog circuitry.

32. The method of claim 29, also including the steps of:

(c) performing a load operation to capture at least one digital-to-analog signal being asserted by the digital circuitry at the end of step (b); and (d) after step (c), performing another scan shift operation to shift the digital-to-analog signal captured during step (c) sequentially out of the boundary scan cell chain.

33. The method of claim 29, wherein the mixed signal circuit is an integrated circuit having at least a first external pin for asserting signals directly to the digital circuitry, at least a second external pin for receiving signals directly from the digital circuitry, at least a third external pin for asserting signals directly to the boundary scan cell chain, and at least a fourth external pin for receiving signals directly from the boundary scan cell chain, wherein step (a) includes the step of:

performing the scan shift operation to shift said test signals from the third external pin sequentially into the boundary scan cell chain, and wherein step (b) includes the steps of:

applying said one or more test signals from an external device directly to the first external pin and receiving at the external device said resulting output signals which have been asserted to the second external pin.

34. The method of claim 33, also including the steps of:

(c) performing a load operation to capture at least one digital-to-analog signal being asserted to said boundary scan cell chain by the digital circuitry at the end of step (b); and (d) after step (c), performing another scan shift operation to shift the digital-to-analog signal captured during step (c) out of the boundary scan cell chain to the fourth external pin.

* * * * *